United States Patent [19]

Gloton et al.

[11] Patent Number: 4,864,383
[45] Date of Patent: Sep. 5, 1989

[54] METHOD OF FABRICATION OF A CHIP CARRIER PACKAGE, A FLUSH-CONTACT CHIP CARRIER PACKAGE AND AN APPLICATION TO CARDS CONTAINING COMPONENTS

[75] Inventors: Jean P. Gloton, Aix En Provence; Philippe Peres, Gardanne, both of France

[73] Assignee: Eurotechnique, Rousset, France

[21] Appl. No.: 914,418

[22] Filed: Oct. 2, 1986

[30] Foreign Application Priority Data

Oct. 11, 1985 [FR] France .................. 85 15114

[51] Int. Cl.⁴ .................. H01L 23/12; H01L 23/30; H01L 23/48
[52] U.S. Cl. .................. 357/68; 357/80; 357/74
[58] Field of Search .................. 357/80, 74, 72, 68

[56] References Cited

U.S. PATENT DOCUMENTS

| | | | |
|---|---|---|---|
| 4,056,681 | 11/1977 | Cook, Jr. .................. | 357/80 |
| 4,138,691 | 2/1979 | Bonkohara et al. .................. | 357/72 |
| 4,323,914 | 4/1982 | Berndmaier et al. .................. | 357/72 |
| 4,532,419 | 7/1985 | Takeda .................. | 357/72 |

Primary Examiner—Rolf Hille
Assistant Examiner—S. V. Clark
Attorney, Agent, or Firm—Pollock, Vande Sande & Priddy

[57] ABSTRACT

A micromodule or chip carrier package for chip containing components has an insulating support base for carrying a series of flush-mounted contact areas. A semiconductor circuit or chip is placed on one of the contact areas and the chip is connected to the other contact areas by means of wires. A hollow case is mounted over the assembly and has a bore for receiving a drop of resin which has the function of protecting the semiconductor circuit or chip.

1 Claim, 1 Drawing Sheet

FIG_1
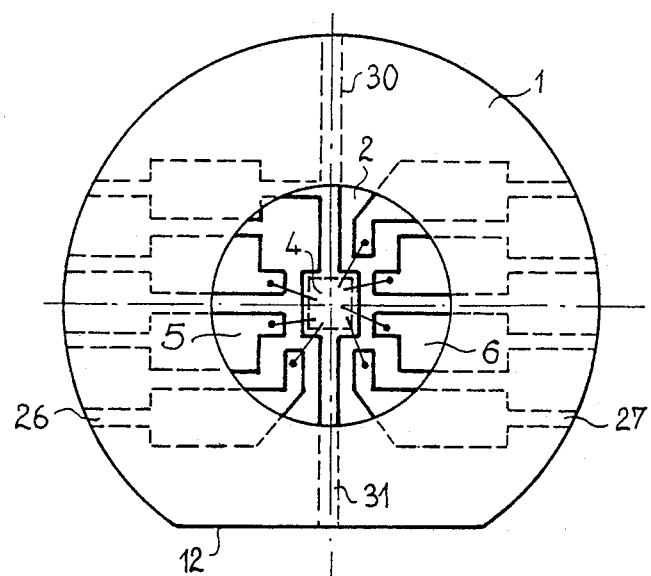
FIG_2
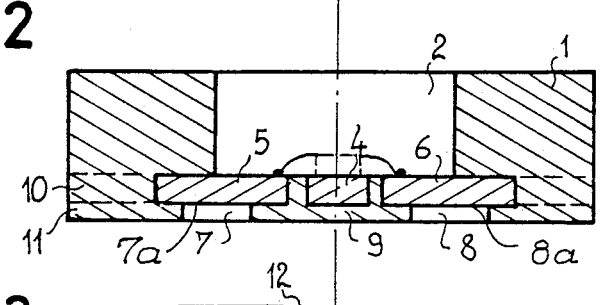
FIG_3
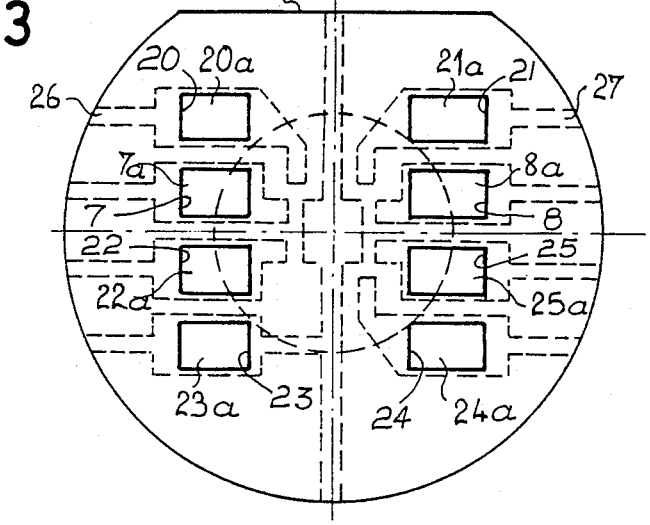

METHOD OF FABRICATION OF A CHIP CARRIER PACKAGE, A FLUSH-CONTACT CHIP CARRIER PACKAGE AND AN APPLICATION TO CARDS CONTAINING COMPONENTS

BACKGROUND OF THE INVENTION

1. Field of the Invention

The present invention relates to a method of fabrication of a chip carrier package. The invention is also directed to a chip carrier package having flush-mounted contacts. Finally, the invention is concerned with an application of a chip carrier package to a card containing chip carrying card or CCC-type components.

2. Description of the Prior Art

A card of the CCC type employed for example in electronic payment comprises a baseboard having a credit-card format and a surface-mounted chip carrier package, also known as a micromodule, which contains both the wire connections, the encapsulation and the electronic circuit of the card.

In the prior art, it is known to fabricate micromodules by making use of a support base on which are mounted conductive portions and a semiconductor circuit for example on a silicon substrate. The final step of the fabrication process consists in depositing a drop of thermosetting resin on the top of the circuit in order to protect the circuit together with its connections and to endow the micromodule with enhanced mechanical strength.

However, the viscosity of resins makes it difficult to guarantee an adequate degrees of dimensional accuracy of the deposited resin drop. The so-called card-packaging operation which involves mounting of the micromodule in the CCC card essentially requires compliance with certain external dimensions of the micromodule. The micromodule must be correctly placed, in depth, in order to prevent any external projection or formation of a hollow portion. In the case of a projection, the micromodule is liable to be turned off at the time the card is introduced into a card reader. In the case of a hollow portion, the hollow portion or depression is liable to form a collecting zone for dirt and foreign matter which may then mask the contacts. The micromodule must also be properly located in the plane of the card. The contacts of the micromodule appear at the surface of the card and are arranged so as to permit reading or interrogation of the chip by contacts of a reader. It is apparent that the shape and dimensions of the resin drop are determining factors in the achievement of good quality of the card. Prior art methods, however, required the resin drop to be subjected to a surface-grinding operation and its shape was not really optimized.

SUMMARY OF THE INVENTION

In order to overcome these disadvantages, the invention proposes a method of fabrication of a chip carrier package. In accordance with this method, there is formed on an insulating support base a succession of contact areas accessible from the exterior of the chip carrier package. One of these contact areas adapted to receive a semiconductor circuit or chip which is electrically connected to the other contact areas by means of wires. A hollow case is then deposited on that face of the support base which carries the semiconductor circuit or chip. Finally, the hollow case is filled with a resin for protecting the semiconductor circuit or chip and said connecting wires.

The invention is also concerned with a novel structure for a chip carrier package which is mounted on a support base and provided with electrical contacts connected to a semiconductor circuit or chip carried by said support base. The chip carrier package in accordance with the invention provides a capsule which is intended to surround a resin drop deposited on the top of the circuit in order to guarantee both the shape and the dimensions of said resin drop.

BRIEF DESCRIPTION OF THE DRAWINGS

Other features of the invention will be more apparent to those versed in the art upon consideration of the following description and accompanying drawings, wherein:

FIG. 1 is a top view of a chip carrier package in accordance with the invention;

FIG. 2 is a corresponding front view in cross-section;

FIG. 3 is the corresponding bottom view.

DESCRIPTION OF THE PREFERRED EMBODIMENTS

It is apparent from the accompanying drawings that the package circuit and its connecting wires have not been installed.

The initial step in the method of fabrication according to the invention involves the fabrication of a module 1 consisting of a support base 11 and contacts.

In a preferred embodiment, the module 1 is fabricated from a metallized plastic film. By means of an etching process such as a photochemical process, contact areas such as 4, 5 and 6 are defined by substantial removal of metal between these areas. Openings 7, 8, 20–25 are formed in base 11 so as to permit access to contact areas of the chip carrier package. One of the contact areas, central area 4 serves as a substrate contact for the semiconductor circuit (or chip shown dotted in the drawings). This circuit or chip has a substantially parallelepipedal shape. Wires are soldered to the circuit or chip in order to establish an electrical connection between the circuit and either face of the contact areas, the openings 7, 8, 20–25 are the electrical access for the chip carrier package.

In one example of construction considered with reference to FIG. 2, the wires which provide a connection between the contact areas, area 5, and the semiconductor circuit or chip mounted on the area 4 are soldered onto the top portion of the leads such as lead 5. It is apparent from FIG. 2 that the package has an annular portion 1 mounted on the support base 11. In the method according to the invention, said annular portion is made of plastic material which can be bonded to the support base 11 in the hot state. The annular portion 1 forms a capsule which makes it possible in particular to confine the connections to the contact areas 20. A first result achieved by the package or case is therefore to improve the mechanical strength of the contact areas formed on metallic strips of very small thickness.

The annular portion 1 also has a central bore 2 through which the semiconductor circuit or chip is deposited on the central area 4. At the end of the package fabrication process, the interior of the central bore 2 is filled with a thermosetting resin. Another result achieved by the invention is to permit accurate calibration of the shape of the resin drop which is deposited on a semiconductor circuit or chip in accordance with the teachings of the prior art, said semiconductor circuit or chip having first been deposited on a conductive area such as the area 4.

It will be noted that, in the example of construction described in the foregoing, the metallic portions are entirely included within the support base 11 and the portion 1. Only openings such as those designated by the references 7, 8, 20–25 permit electrical access after fabrication of the micromodule. FIGS. 2 and 3 reference the opening (such as 7, 8 and 20–25) as well as that face of the contact area (7a, 8a and 20a–25a) accessible via the opening. In an alternative form of construction, metallization of said openings or bores is carried out in addition so as to permit easier reading. This arrangement effectively overcomes problems relating to detachment of contact areas at the time of reading.

In accordance with another distinctive feature of the invention, the contact areas are formed by cutting or photoetching in a metallic strip. The cut-out portions are such as to define a particular connection pattern corresponding to the total circuit desired. Moreover, tags such as the tags 26 and 27 on the contact areas 5 and 6 of FIG. 1 are provided in order to reinforce the anchoring of each contact area in the micromodule. Similarly, the central area 4 is extended by tags 30–31.

What is claimed is:

1. A chip carrying package for use in a portable chip carrying card of the kind which can be removably inserted in a card reading apparatus, said package comprising an insulating base support having an upper surface and a lower surface, conductive leads deposited on the upper surface of the base support, openings provided in said base support for exposing a portion of at least one of said conductive leads and making said exposed portion accessible from the lower surface of the support for direct electrical contact with contact elements of a card reading apparatus, a semiconductor chip mounted on the upper surface of the support and electrically connected through electrical connections to said conductive leads, a hollow case placed on the upper surface of the support surrounding said chip and said electrical connections, and a protective resin filling said hollow case.

* * * * *